(12) United States Patent
Smith

(10) Patent No.: US 6,395,433 B1
(45) Date of Patent: May 28, 2002

(54) PHOTOMASK FOR PROJECTION LITHOGRAPHY AT OR BELOW ABOUT 160 NM AND A METHOD THEREOF

(75) Inventor: Bruce W. Smith, Webster, NY (US)

(73) Assignee: Rochester Institute of Technology, Rochester, NY (US)

(*) Notice: Subject to any disclaimer, the term of this patent is extended or adjusted under 35 U.S.C. 154(b) by 0 days.

(21) Appl. No.: 09/415,149

(22) Filed: Oct. 8, 1999

Related U.S. Application Data

(60) Provisional application No. 60/124,954, filed on Mar. 18, 1999, and provisional application No. 60/103,542, filed on Oct. 8, 1998.

(51) Int. Cl.$^7$ ................................................. G03F 9/00
(52) U.S. Cl. .......................................... 430/5; 430/322
(58) Field of Search ..................... 430/5, 322; 378/34, 378/35

(56) References Cited

U.S. PATENT DOCUMENTS

| | | | |
|---|---|---|---|
| 4,890,309 A | * 12/1989 | Smith et al. | 378/35 |
| 5,582,939 A | 12/1996 | Pierrat | 430/5 |
| 5,795,684 A | * 8/1998 | Troccolo | 430/5 |
| 5,811,208 A | 9/1998 | Yokoyama et al. | 430/5 |
| 5,897,977 A | 4/1999 | Carcia et al. | 430/5 |
| 5,935,733 A | 8/1999 | Scott et al. | 430/5 |
| 5,935,735 A | 8/1999 | Okubo et al. | 430/5 |

* cited by examiner

*Primary Examiner*—Mark F. Huff
*Assistant Examiner*—Saleha R. Mohamedulla
(74) *Attorney, Agent, or Firm*—Nixon Peabody LLP

(57) ABSTRACT

An attenuated phase shift mask for use in a lithography process includes a masking film made of at least one material with at least a silicon component which provides a transmission above about 0.5 percent and a phase shift of about a 180° for radiation at a wavelength at or below about 160 nm.

63 Claims, 6 Drawing Sheets

```
20 ─►  ┌─────────────────────────────┐
       │ 2 si3n4_uv          55 A    │─── 18
       ├─────────────────────────────┤
       │ 1 a-si_uv          700 A    │─── 12
       ├─────────────────────────────┤
       │ 0 caf2_uv           1 mm    │─── 14
       └─────────────────────────────┘
```
FIG. 14
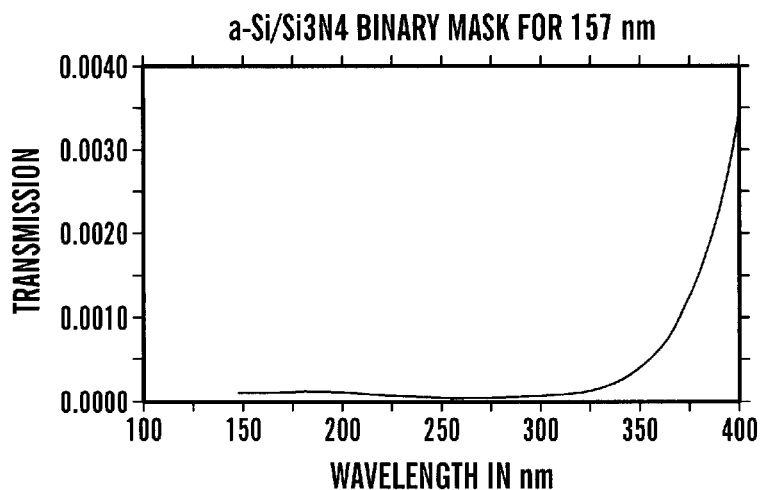
FIG. 15
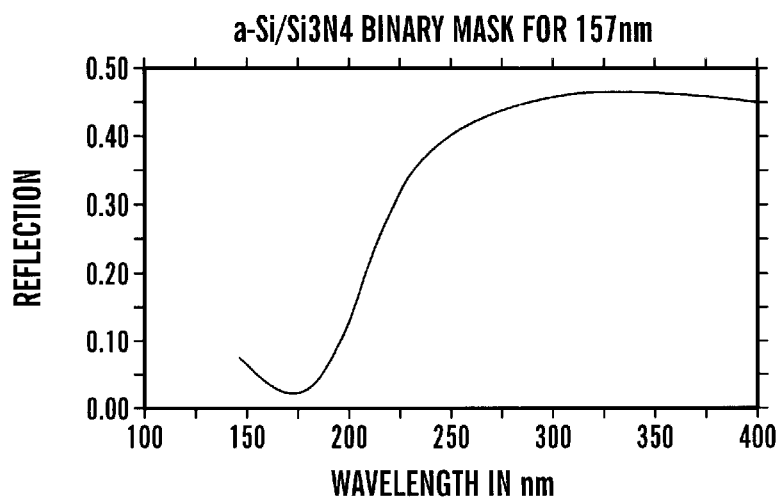
FIG. 16

PHOTOMASK FOR PROJECTION LITHOGRAPHY AT OR BELOW ABOUT 160 NM AND A METHOD THEREOF

This application claims the benefit of U.S. Provisional Patent Application Serial No. 60/103,542 filed on Oct. 8, 1998 and of U.S. Provisional Patent Application Ser. No. 60/124,954 filed on Mar. 18, 1999 which are both herein incorporated by reference.

FIELD OF THE INVENTION

This invention relates generally to lithography and, more particularly, to a photomask for projection lithography at or below about 160 nm and a lithography method using that mask.

BACKGROUND OF THE INVENTION

Optical lithography has been one of the principal driving forces behind the continual improvements in the size and performance of the integrated circuit (IC). Feature resolution down to 0.18 $\mu$m is now possible using the 248 nm Hg lamp or KrF excimer laser wavelengths and optical projection tools operating at numerical apertures above 0.55. The industry is now at a point though where resolution is limited for current optical lithographic technologies. In order to extend capabilities for the next millennium toward sub-0.13 $\mu$m, modifications in source wavelength, optics, illumination, masking, and process technology are required and are getting a tremendous amount of attention.

With respect to masking, control of the phase information at a mask may allow for manipulation of imaging performance to achieve smaller feature resolution. Phase shift masking (PSM) employs constructive and destructive interference to improve both resolution and focal depth for a variety of feature types. For dense features, a transparent phase shifter added to or subtracted from alternating mask openings allows for a doubling in resolution by decreasing the mask and wafer electric field frequency. A lens acting on this diffracted mask information has a 50% decrease in the numerical aperture requirements. Phase shift masking using such an alternating shifter approach can also result in reduced sensitivity to defocus and other aberrations, but is limited to dense grating type mask features. Variations in the alternating phase shift mask have been developed to allow for application to non-repetitive structures. Depending on the mask fabrication technique, process control may limit the manufacturability of these types of phase shift masks for short UV wavelength exposures. Each of these prior phase-shift masking approaches also requires some level of added mask and process complexity and none of these techniques can be used universally for all feature sizes and shapes. Accordingly, an approach which can minimize mask design and fabrication complexity may gain the greatest acceptance for application to manufacturing.

An attenuated phase shift mask (APSM) may be such an approach. Using this approach, conventional opaque areas on a binary mask are replaced with partially transmitting regions (up to 100%) that produce a $\pi$ phase shift with respect to clear regions as disclosed in U.S. Pat. No. 4,890,309 to Smith et al. which is herein incorporated by reference.

In an ASPM, as light travels through a transparent material, a phase shift occurs based on the refractive index $n_f(l)$ and thickness t of the medium. By design, APSM films are not transparent but possess a transmissive characteristic based on the material's extinction coefficient k(l). As k(l) increases, an abrupt phase shift also occurs at the air-film interface. As these materials are considered, it is the complex refractive index $n^*=n+ik$ that is of interest. The phase shifting effect as light travels through a semitransparent material can be expressed as:

$$\phi=(2\pi/\lambda)[n_f(\lambda)-1]t+\arg[2n^*_2/(n^*_1+n^*_2)]$$

where $n^*_1$ and $n^*_2$ are complex refractive indices of the first and second medium respectively. This equation assumes that the phase contribution from the APSM film-substrate interface is negligible, which is a reasonable approximation. A third term to the equation above could be included to account for this phase change if desired. The transmission properties of an APSM film are determined as:

$$T=\exp(-4\pi kt/\lambda).$$

Preferably, the APSM should provide transmission above about 0.5 percent for wavelengths at or below about 160 nm and also provide about a 180° phase shift.

Additionally, an APSM which comprises a single layer film (or a material that can be processed as a single layer film) is most attractive from the standpoint of mask process complexity. There are several requirements for a single layer APSM material in order for it to be considered production worthy. Materials must exhibit suitable optical transmission and phase shifting properties and allow for pattern delineation (etching), radiation stability, and durability. Additionally, there may be optical requirements of the material at longer wavelengths, since any mask must be compatible with inspection and alignment operations.

The APSM film should also possess adequate etch characteristics and selectivity to both the resist and the substrate. Conventional wet etching is not anisotropic and limitations are being realized for current mask applications. Plasma-reactive ion etch (RIE) will be a requirement for these next generation masking materials, which presents both chemical and physical challenges to pattern transfer. Without sufficient selectivity to the mask substrate, etching of the mask substrate will contribute to phase shifting effects and thus will need to be accounted for. As exposure wavelengths are pushed below 160 nm, etch control becomes increasingly critical. Without adequate etch selectivity, a transparent etch stop layer would be required between the APSM film and the substrate. Suitable materials for use as an etch stop are increasingly difficult to identify at short UV wavelengths.

Work in areas of attenuated phase-shift masking has demonstrated both resolution and focal depth improvement for a variety of feature types. However, prior to the present invention practical materials for use in an APSM for IC mask fabrication which can satisfy the 180° phase-shift and the required transmittance, at targeted wavelengths below about 160 nm, such as 157 nm, 148 nm or 126 nm, within a given film thickness, and which satisfy the other requirements noted above have not been found.

Several materials, such as CrO, CrN, CrF, AlN, $Si_xN_y$, TASiO, MoO, MoN, ZrN, ZrO, or other variations or combinations of these materials on a fused silica mask substrate, have been explored for use as masking films for use at the longer wavelengths, such as 365, 248 and 193) nm. Unfortunately, these materials are generally not the best starting point for the design of an APSM for sub-160 nm applications since absorption of both APSM materials and fused silica substrates increase significantly below 180 nm. Also, some combinations of these materials lead to poor etch selectivity between the mask and the mask substrate.

SUMMARY OF THE INVENTION

A mask for use in a lithography process in accordance with one embodiment of the present invention includes a masking film made of at least one material with at least a silicon component which provides a transmission above about 0.5 percent and a phase shift of about a 180 for radiation at a wavelength at or below about 160 nm.

An attenuated phase shift mask in accordance with another embodiment of the present invention includes a substrate with at least one surface and a masking film made of at least one material with at least a silicon component. The masking film is located on at least a portion of the one surface of the substrate and provides a transmission above about 0.5 percent and a phase shift of about a 180° for radiation at a wavelength at or below about 160 nm.

A method for lithography in accordance with another embodiment of the present invention includes a few steps. First, a masking film made of at least one material with at least a silicon component is placed over at least a portion of the one surface of a substrate. Next, the masking film and the substrate are exposed to radiation at a wavelength at or below about 160 nm. The masking film provides a transmission above about 0.5 percent and a phase shift of about a 180° for radiation at a wavelength at or below about 160 nm.

Another attenuated phase shift mask for use in a lithography process in accordance with another embodiment of the present invention includes a mask comprising at least silicon which provides a transmission below about 0.5 percent for radiation at a wavelength at or below about 160 nm.

Another mask in accordance with another embodiment of the present invention includes a substrate with at least one surface and a masking film on at least a portion of the one surface of the substrate. The masking film is made of at least silicon and provides a transmission below about 0.5 percent for radiation at a wavelength at or below about 160 nm.

Another method for lithography in accordance with another embodiment of the present invention also includes a few steps. First, a masking film made of at least silicon is placed over at least a portion of one surface of a substrate. Next, the masking film is exposed to radiation at a wavelength at or below about 160 nm. The masking film provides a transmission below about 0.5 percent for radiation at a wavelength at or below about 160 nm.

The present invention provides a number of advantages including providing a mask which has desirable optical properties for use in optical lithography at or below about 160 nm. More specifically, the masking film is made of at least one material with a silicon component and is capable of producing a phase shift of 180° with transmission at a targeted wavelength at or below about 160 nm (such as 157 nm, 148 nm, or 126 nm) above about 0.5 percent and up to 100 percent. The material or materials used in the masking film (that is the thin film which controls the phase shifting and transmission of sub-160 nm radiation) are based on the unique extinction coefficient properties of silicon and/or silicon dielectrics (including silicon dioxide, $SiO_2$, and silicon nitride, $Si_3N_4$) below 160 nm. Preferably, the substrate is essentially transparent. The low extinction coefficient value of silicon below 160 nm allows it to be incorporated at a significant level in the masking film to permit tailoring of the optical properties of the mask which is not possible at longer lithographic wavelengths. Additionally, the higher extinction coefficient of silicon for wavelengths above 160 nm (from a value near 1.6 to a value near 3.0 at 300 nm), allows for the control of longer wavelength transmission in the mask to be sufficiently low to allow for mask inspection and mask alignment.

Another advantage of the present invention is that the desired short and long wavelength transmission properties of the mask as well as its thermomechanical and exposing radiation stability properties can be customized through the use of additional materials in the masking film. More specifically, absorbing metal oxides, such as oxides of Ta, Mo, Ti, Fe, Ru, Mn, Cu, Cr, Ni, V, Nb, Hf, Sn, In, and Co, can be combined with silicon dioxide to decrease transmission properties of the APSM film below 160 nm and at longer wavelengths. Similarly, absorbing metal nitrides, such as nitrides of Ta, Mo, Ti, Fe, Ru, Mn, Cu, Cr, Ni, V, Nb, Hf, Sn, In, and Co, can also be combined with silicon nitride to decrease transmission properties of the APSM film below 160 nm and at longer wavelengths.

The present invention also provides suitable selectivity, preferably about 10:1 or better, between the mask and the underlying substrate as the result of the combination of a material with a silicon component in the mask and material with a fluoride component in the substrate. Materials with silicon are volatile in fluorine chemistry, whereas materials with fluorine are stable in the same chemistry. As a result, with the present invention the mask can be etched without a significant loss of the underlying substrate or resist material. Alternatively, a fused silica substrate ($SiO_2$) can be used without a fluoride film when selectivity is less than 10:1 with the masking film, but etch control is achieved through careful process control, i.e. etch through the masking film 12 then stop at the surface of the substrate 14.

Yet another advantage of the present invention is that reflectivity at the masking film/air interface may be reduced through use of an optical interference coating, such as a silicon-based dielectric film (such as silicon nitride or silicon dioxide) with thickness adjusted to result in absorption and quarter wave interference at the targeted wavelength at or below 160 nm.

Yet another advantage of the present invention is that the mask can be modified for use in applications where the transmission is below about 0.5% and phase shifting is not required. In this particular embodiment, the mask is a binary mask and the masking film thickness is adjusted to control transmission properties at the targeted wavelength below 160 nm.

BRIEF DESCRIPTION OF THE DRAWINGS

FIG. 14 is a cross-sectional diagram of a 157 nm mask in accordance with another embodiment of the present invention;

FIG. 15 is a graph illustrating the transmission properties from 150 to 400 nm for the binary 157 nm mask shown in FIG. 13; and FIG. 16 is a graph illustrating the reflection of the 157 nm binary mask shown in FIG. 13 from 150 nm to 400 nm.

DETAILED DESCRIPTION

Figure 1A:
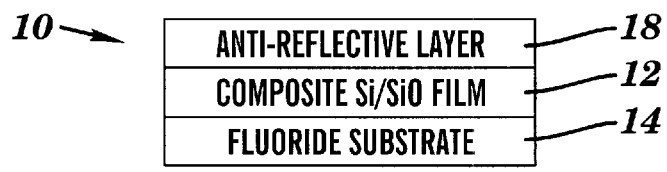
FIG. 1A is a cross-sectional diagram of a 157 nm attenuated phase shift mask in accordance with one embodiment of the present invention.
Figure 1B:
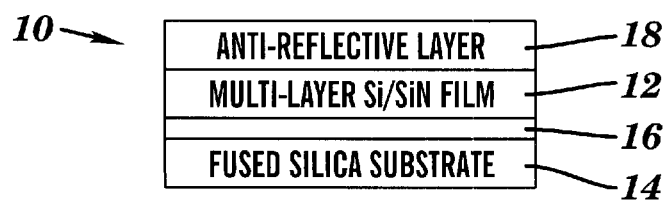
FIG. 1B is a cross-sectional diagram of a 157 nm attenuated phase shift mask in accordance with another embodiment of the present invention.
Figure 1C:
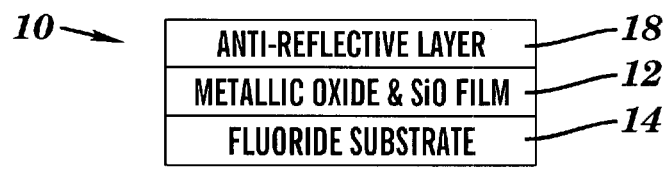
FIG. 1C is a cross-sectional diagram of a 157 nm attenuated phase shift mask in accordance with yet another embodiment of the present invention.
Figure 1D:
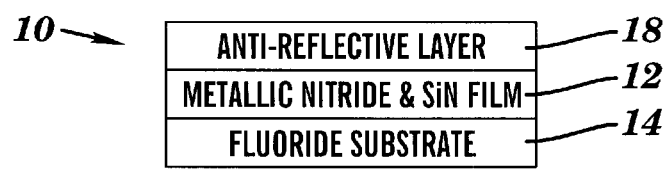
FIG. 1D is a cross-sectional diagram of a 157 nm attenuated phase shift mask in accordance with yet another embodiment of the present invention.
Figure 1E:
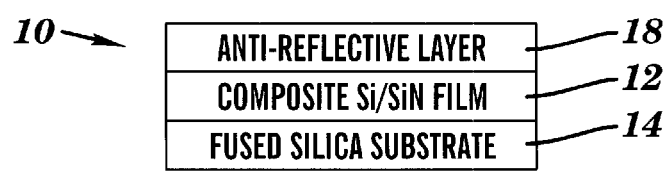
FIG. 1E is a cross-sectional diagram of a 157 nm attenuated phase shift mask in accordance with yet another embodiment of the present invention.

Some examples of attenuated phase shift masks 10 for use in lithography at or below 160 nm in accordance with different embodiments of the present invention are illustrated in FIGS. 1–1E. Each of these masks 10 comprises a masking film 12 made of at least one material with at least a silicon component which provides for a transmission above about 0.5 percent and a phase shift of about a 180° for radiation at a wavelength at or below about 160 nm and the underlying substrate 14. The present invention provides a number of advantages including providing a mask 10 which has suitable optical properties for lithography at or below about 160 nm, has optical properties which can be easily modified, and has suitable etch characteristics between the mask 10 and the underlying substrate 14.

Referring to FIGS. 1A–1E, the masking film 12 is made of at least one material which has a silicon component and is capable of producing a phase shift of about 180° with a transmission above about 0.5 percent and up to 100 percent at a targeted wavelength at or below about 160 nm (such as 157 nm, 148 nm, or 126 nm) in these particular embodiments. The particular material or materials with a silicon component used in the mask 10 (that is the thin film which controls the phase shifting and transmission of sub-160 nm radiation) are based on the refractive index of and the unique extinction coefficient properties of silicon and/or silicon dielectrics (including silicon dioxide, $SiO_2$, and silicon nitride, $Si_3N_4$) below 160 nm. The low extinction coefficient value of silicon below 160 nm allows it to be incorporated at a significant level in the masking film 12 to permit tailoring of the optical properties of the mask 10 which is not possible at longer lithographic wavelengths. Additionally, the higher extinction coefficient of silicon for wavelengths above 160 nm (from a value near 1.6 to a value near 3.0 at 300 nm), allows for the control of longer wavelength transmission in the masking film 12 to be sufficiently low to allow for mask inspection and mask alignment.

A variety of different materials with a silicon component can be used for the masking film 12. By way of example only, the masking film 12 may be made of silicon and silicon dioxide as shown in FIG. 1A, silicon and silicon nitride as shown in FIGS. 1B and 1E, a metallic oxide and silicon dioxide as shown in FIG. 1C, or a metallic nitride and silicon nitride as shown in FIG. 1D. Additionally, by using additional materials, such as a metallic oxide or a metallic nitride, the desired short and long wavelength transmission properties of the mask 10 as well as its thermomechanical and exposing radiation stability properties can be customized. More specifically, absorbing metal oxides, such as oxides of Ta, Mo, Ti, Fe, Ru, Mn, Cu, Cr, Ni, V, Nb, Hf, Sn, In, and Co, can be combined with silicon dioxide to decrease transmission properties of the APSM film below 160 nm and at longer wavelengths. Similarly, absorbing metal nitrides, such as nitrides of Ta, Mo, Ti, Fe, Ru, Mn, Cu, Cr, Ni, V, Nb, Hf, Sn, In, and Co, can also be combined with silicon nitride to decrease transmission properties of the APSM film below 160 nm and at longer wavelengths. By varying the types of and ratios of these constituent materials for the masking film 12, control of the refractive index and extinction coefficient values allowed by and the resulting optical properties of the mask 10 can be achieved.

The particular thickness of the masking film 12 is selected to produce a phase shift of about 180°. The thickness of the masking film 12 depends upon the material or materials used to make the masking film 12 and the particular wavelength of the target radiation. Typically, the masking film 12 at a targeted wavelength at or below about 160 nm will have a thickness between about 200 Å and 2000 Å to produce the desired phase shift of about 180°.

Additionally, the masking film 12 may be comprised of a single or monolayer as shown in FIGS. 1A, 1C, 1D, or 1E or multiple layers as shown in FIG. 1B. If the masking film 12 is made multiple layers, preferably the layers are each sufficiently thin such that optical and process homogeneity exists so that the multiple layers act as a psuedo-monolayer.

The masking film 12 is located on one surface of a substrate 14. A variety of different types of substrates 14. can be used as long as the substrates 14 is made with at least one material with a fluoride component, the substrates 14. is coated with a fluoride material, or an etch allows sufficient control of masking film 12 removal without etching the substrate 14. By way of example only, as shown in FIGS. 1A, 1C, 1D, and 1E the substrates 14. may be a fluoride substrate 14, such as magnesium fluoride, calcium fluoride, lithium fluoride, or barium fluoride, although any type of fluoride optical materials sufficiently transparent below 160 nm with mechanical, chemical, and physical properties to allow for application as a substrates 14. can be used. Alternatively, as shown in FIG. 1B the substrates 14. could be a material, such as fused silica with a suitably low absorbance, with a coating 16 with a fluoride component, such as $MgF_2$, between the masking film 12 and the fused silica substrates 14. which the fluoride coating 16 acts as an etch stop layer to allow for the required etch selectivity. Further, as shown in FIG. 1E, the substrates 14. could be made of fused silica without a fluoride film coating if the etching process can be controlled to stop once the masking film 12 is etched.

One of the advantages of one embodiment of the invention is that by using a masking film 12 made with at least one material with at least silicon component on a substrates 14. made of at least one material with at least a fluoride component or a substrates 14. with a fluoride coating 16 between the masking film 12 and the substrate 14 the necessary selectivity between the masking film 12 and the substrates 14. for etching is produced. Preferably, the selectivity between the masking film 12 and substrates 14. with this combination is about 10:1 or better. This particular combination works because materials with silicon are volatile in fluorine based plasma etch chemistry, while materials with fluorine are stable in the same chemistry because these fluoride materials are in stable form (boiling points are above 2000° C.). As a result, with the present invention the masking film 12 can be etched without a significant loss of the underlying substrate 14.

An optional anti-reflective layer 18 may be located or coated on the surface of the masking film 12 opposing one surface of the substrate 14. Preferably, the material or materials used to form the anti-reflective layer 18 are adjusted to produce minimum reflectivity through quarter wave interference. More specifically, the anti-reflective layer 18 is coated to a thickness of $\lambda/4n$ (where n is the complex refractive index and this thickness allows for destructive interference of reflective effects). In this particular embodiment, the anti-reflective layer 18 is made of a silicon based dielectric, such as silicon nitride or silicon dioxide. As a result, etching of the masking film 12 along with the anti-reflective layer 18 can be carried out in fluorine based plasma with significant selectivity to the substrates 14. as discussed earlier. Set forth below with reference to FIGS. 2–13 are some examples of masks 10 which provide a transmission above 0.5% and a phase shift of about a 180° for radiation at a wavelength of about 157 nm in accordance with different embodiments of the present invention.

Figure 2:
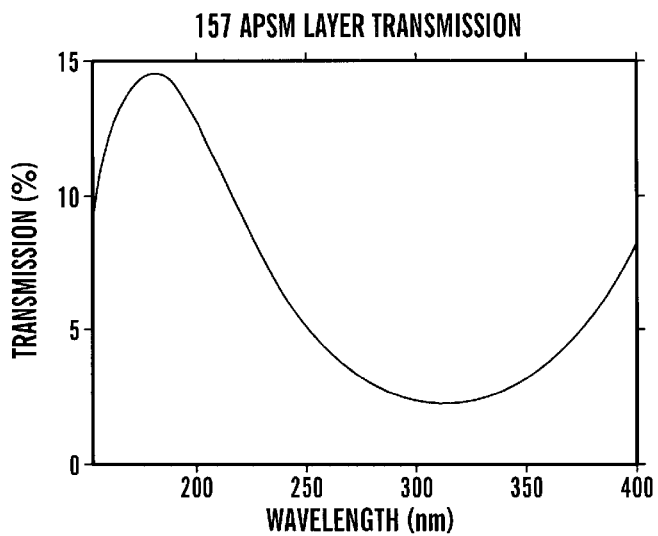
FIG. 2 is a graph illustrating the transmission of a 157 nm APSM mask in accordance with another embodiment of the present invention.
Figure 3:
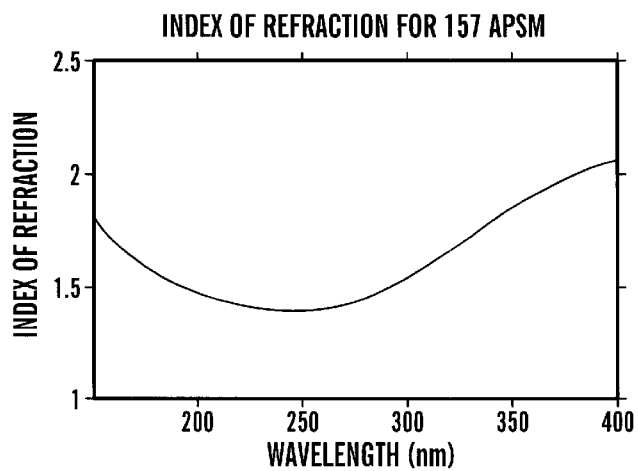
FIG. 3 is a graph illustrating the index of refraction for the mask shown in FIG. 2 from 150 nm to 400 mn.
Figure 4:
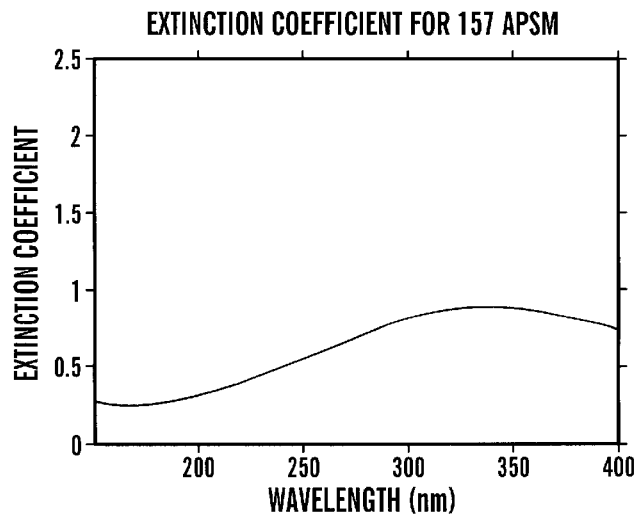
FIG. 4 is a graph illustrating the extinction coefficient for the mask shown in FIG. 2 from 150 nm to 400 mn.

Referring to FIG. 2, the optical transmission for a silicon+ silicon nitride mask 10 deposited with ratios of 32% silicon and 68% silicon nitride on a calcium fluoride substrate is shown. In this particular example, the targeted 157 nm transmission is 10% and the graph shows the decreasing transmission to less than 5% above 250 mn. Referring to FIGS. 3 and 4, the optical constants for this mask 10 are shown. In this particular example, the masking film 12 has a thickness of about 1016 Å to achieve a 180° phase shift at 157 nm. The particular masking film 12 thicknesses are chosen corresponding to the condition $2(n-1)t=\frac{1}{2}$ or an odd multiple thereof.

Figure 5:
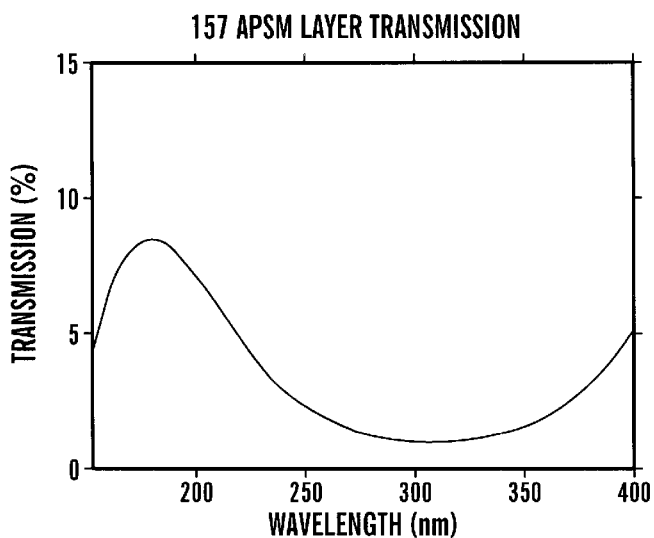
FIG. 5 is a graph illustrating the transmission of a 157 mn APSM mask in accordance with another embodiment of the present invention.
Figure 6:
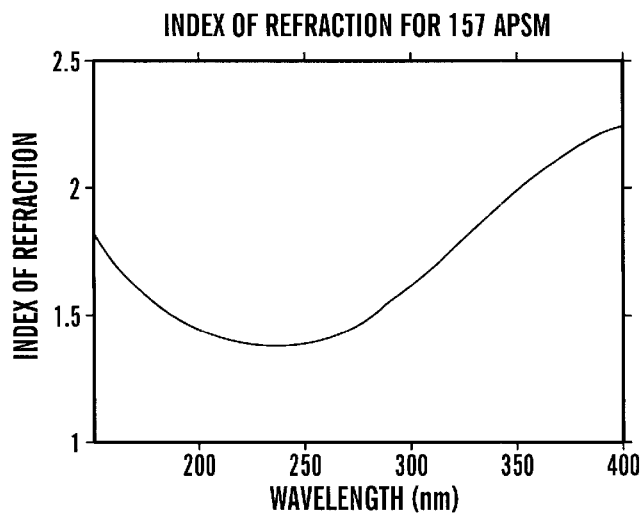
FIG. 6 is a graph illustrating the index of refraction for the mask shown in FIG. 5 from 150 nm to 400 nm.
Figure 7:
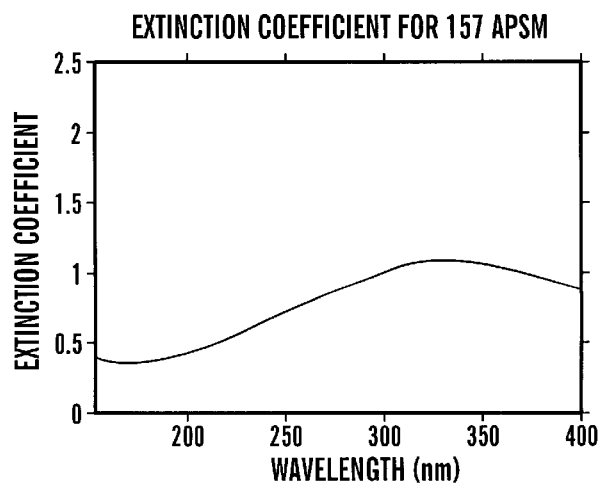
FIG. 7 is a graph illustrating the extinction coefficient for the mask shown in FIG. 5 from 150 n to 400 nm.

Referring to FIG. 5, the optical transmission for a sputtered silicon/silicon dioxide mask 10 deposited with ratios of 38% silicon and 62% silicon dioxide on a calcium fluoride substrate is shown. In this particular example, the targeted 157 nm transmission is 5% and the graph shows the decreasing transmission to less than 3% above 250 nm. Referring to FIGS. 6 and 7, the optical constants for this particular mask 10 are shown. In this particular example, the masking film 12 has a thickness of about 1002 Å to produce a 180° phase shift at 157 nm.

Figure 8:
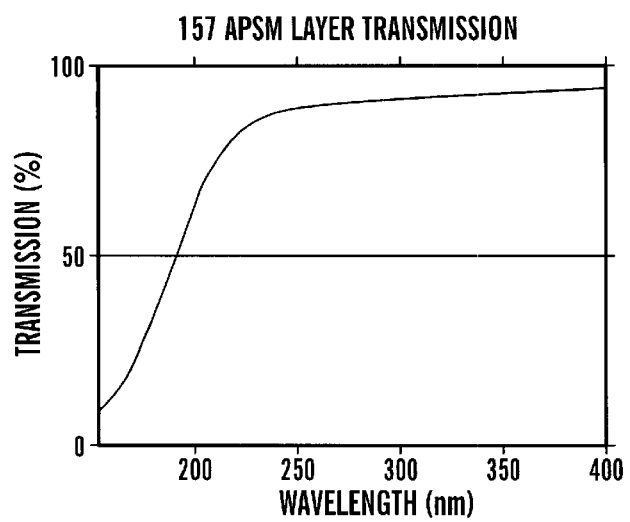
FIG. 8 is a graph illustrating the transmission of a 157 nm APSM mask in accordance with another embodiment of the present invention.
Figure 9:
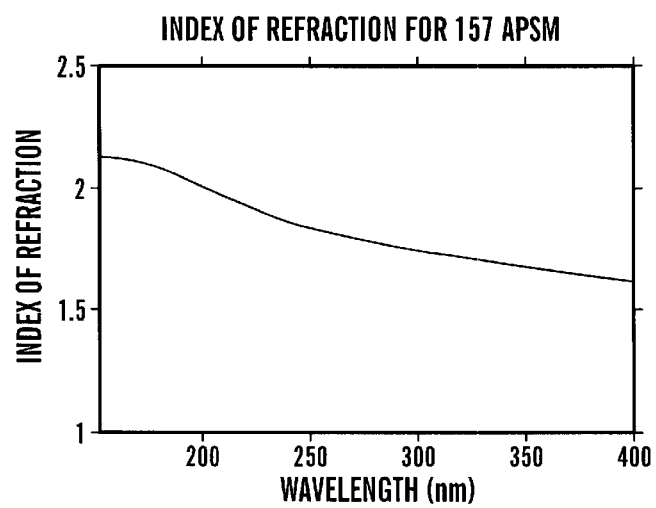
FIG. 9 is a graph illustrating the index of refraction for the mask shown in FIG. 8 from 150 mn to 400 mn.
Figure 10:
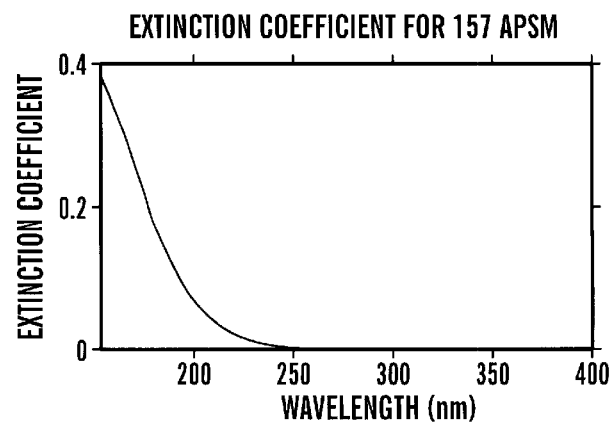
FIG. 10 is a graph illustrating the extinction coefficient for the mask shown in FIG. 8 from 150 nm to 400 nm.

Referring to FIG. 8, the optical transmission for sputtered silicon nitride/silicon dioxide mask 10 deposited with ratios of 49% silicon nitride and 51% silicon dioxide on a calcium fluoride substrate is shown. In this particular example, the targeted 157 nm transmission is 10%. Referring to FIGS. 9 and 10, the optical constants for this particular mask 10 are shown. In this particular example, this masking film 12 has a thickness of about 709 Å to produce a 180° phase shift at 157nm.

Figure 11:
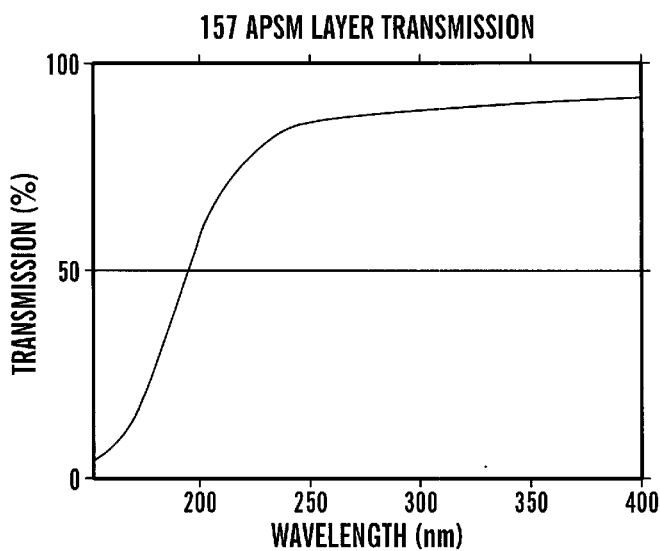
FIG. 11 is a graph of the transmission of a 157 nm APSM mask in accordance with another embodiment of the present invention.
Figure 12:
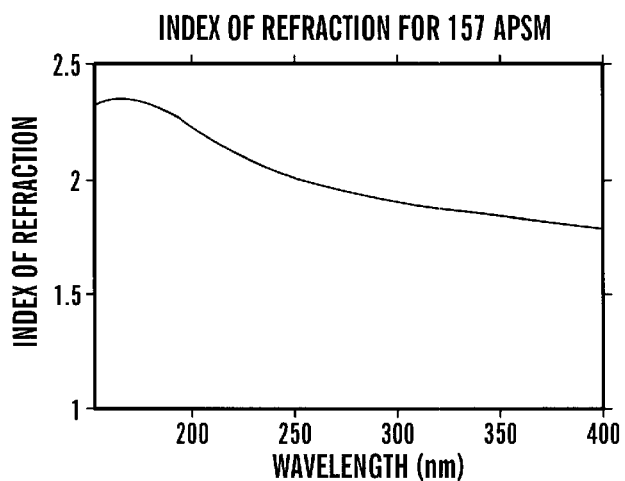
FIG. 12 is a graph illustrating the index of refraction for the film mask shown in FIG. 11 from 150 nm to 400 nm.
Figure 13:
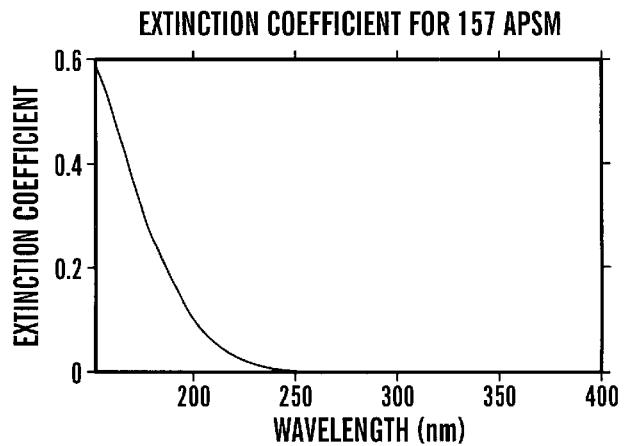
FIG. 13 is a graph illustrating the extinction coefficient for the mask shown in FIG. 11 from 150 nm to 400 nm.

Referring to FIG. 11, the optical transmission for a sputtered silicon nitride/silicon dioxide mask 10 deposited with ratios of 70% silicon nitride and 29% silicon dioxide on a calcium fluoride substrate is shown. In this particular example, the targeted 157 nm transmission is 5% and the graph shows the increasing transmission to about 80% above 250 nm. Referring to FIGS. 12 and 13, the optical constants for this particular mask 10 are shown. In this particular example, this masking film 12 has a thickness of about 601 Å to produce a 180° phase shift at 157 nm.

The optical properties and thicknesses of masking films 12 discussed in the examples above were determined using various methods including spectroscopic ellipsometry at wavelengths above 180 nm, VUV spectrophotometry (reflectance and transmission measurements) from 10 nm to 200 nm, and profilometry thickness measurements. Refractive index and extinction coefficient values were fitted from these measurements to cover the 150 to 400 nm range. Effective media approximation (EMA) modeling allowed for prediction and iteration to appropriate solutions.

Referring to FIG. 14, another embodiment of the present invention is shown for use in applications where the needed transmission is below about 0.5% and phase shifting is not required. In this particular embodiment, this mask 20 comprises a masking film 12 made of silicon alone and having a thickness near 700 Å with a silicon nitride anti-reflective layer 18 having a thickness near 55 Å thick on a calcium fluoride substrate 14. Although silicon alone is shown for use as the mask, other materials, such as $W_1$, $Nb_1$, Ti, Ta, Nb, which can reduce the transmission below 0.5% can also be used. Additionally, although a calcium fluoride substrates 14. is shown, any type of fluoride optical materials sufficiently transparent below 160 nm with mechanical, chemical, and physical properties to allow for application as a substrate 14 for the mask 20, such as magnesium fluoride, lithium fluoride, barium fluoride, or fused silica, can be used. Further, although silicon nitride is used for the masking film 12, any silicon based dielectric, such as silicon dioxide, can be used so that etching of the masking film 12 can still be carried out in fluorine based plasma with significant 20 selectivity to the substrate 14.

Referring to FIGS. 15 and 16, the transmission and reflection properties of the mask 20 shown in FIG. 14 from about 150 nm to 400 nm are shown. As shown in FIG. 15, the transmission for this mask 20 at 157 nm is below 0.5%. As shown in FIG. 16, the reflection for this mask 20 at 157 nm is below 3% and can be controlled by adjusting the thickness of the silicon nitride layer.

Etching properties of various materials with silicon as a component were determined in various fluorine chemistries. By way of example only, plasma etching can be used to etch the masks 10 and 20. In this example, plasma etching is carried out in a modified Plasma Therm RIE system utilizing a single wafer parallel plate chamber. The lower electrode is 15.2 cm in diameter and was not cooled during operation. The electrode was modified for uniform etching of calcium fluoride samples. Etch rates in this example were determined using profilometry. Etch gases studied included $SF_6$ and $CF_4$. The results of these etching examples are shown in Table 1 below and demonstrate the desirable etch selectivity of the masks 10 and 20 with respect to the substrates 14.as described above in accordance with different embodiments of the present invention. In each of these particular examples, power was held at 200 W, pressure was 200 mTorr, and gas flow was 30 sccm. As illustrated by these results, the etch selectivity of the masking film 12 to the substrate is effectively infinite.

| Etch gas | Silicon etch rate | Si3N4 etch rate | SiO2 etch rate | CaF2 etch rate |
|---|---|---|---|---|
| SF$_6$ | 50 Å/min | 500 Å/min | 200 Å/min | 0 Å/min |
| CF$_4$ | 75 Å/min | 2200 Å/min | 650 Å/min | 0 Å/min |

Although one etching technique is disclosed, other etching techniques can be used as needed or desired.

A lithographic process using a mask 10 or 20 in accordance with one embodiment of the present invention will be discussed with reference to FIGS. 1A 1D, and 14. First, masking film 12 is placed over the one surface of the substrates 14 or the layer of photo resist material, if used. Again, the masking film 12 comprises at least one material with a silicon component, such as a composite of silicon, silicon oxide or dioxide, and silicon nitride either co-deposited to produce a true homogeneous film or deposited at thickness so that the resulting multi-layer film stack behaves as a homogenous film. Additionally, absorbing metal oxides, such as oxides of Ta, Mo, Ti, Fe, Ru, Mn, Cu, Cr, Ni, V, Nb, Hf, Sn, In, and Co, could be combined with silicon dioxide being deposited to form the masking film 12 to decrease transmission properties of the APSM film below 160 nm and at longer wavelengths. Similarly, absorbing metal nitrides, such as nitrides of Ta, Mo, Ti, Fe, Ru, Mn, Cu, Cr, Ni, V, Nb, Hf, Sn, In, and Co, could be combined with silicon nitride being deposited to form masking film 12 to decrease transmission properties of the APSM film below 160 nm and at longer wavelengths. To produce one of these masking films 12 on the substrate 14, deposition conditions are chosen so that deposition rates produce desired ratios, dwell times produce desired ratios, or deposition target density produces desired ratios.

In these particular examples, the masks 10 and 20 were produced by reactive rf magnetron sputtering of silicon, silicon dioxide, and/or silicon nitride from 8" silicon targets onto 0.5"×1.0" calcium fluoride substrates. Masking films 12 were sputtered at power levels between 500W and 1500W with an evacuated pressure of~1×10$^{-7}$ Torr. Prior to sputtering, substrates 14. were cleaned and dehydrated to reduce reactivity with oxygen. Masking films 12 were deposited without additional substrate heating. Composite film formation is made possible through control of partial pressure of argon, nitrogen, and/or oxygen or by depositing sub-wavelength thicknesses of each constituent and alternating at the appropriate thickness ratio. Masking films 12 can also be deposited by direct sputtering from silicon, silicon dioxide, and/or silicon nitride targets and by passing substrates 14. under or over each target for a required amount of time. Although one technique for depositing the masking films 12 on the substrates 14. is disclosed, other techniques can be used as needed or desired.

Next, an optional anti-reflective layer 18 may be added over the masking film 12. Again, the material or materials used to form the anti-reflective layer 18 are adjusted to produce minimum reflectivity through quarter wave interference. Typically, the anti-reflective layer 18 is added to reduce the reflectivity to be preferably below about 15%, although the desired percentage of reflectivity can vary as needed or desired.

Next, the masking film 12 and the optional anti-reflective layer 18, if used, are etched to form the desired pattern. A variety of different techniques can be used to etch the masking film 12 and the anti-reflective layer 18, such as using halogen chemistries, which are well known to those of ordinary skill in the art and thus will not be described here. Again, since the anti-reflective layer 18 is made of a silicon based dielectric and the masking film 12 is made of at least one material with a silicon component, etching of the masking film 12 along with the anti-reflective layer 18 can be carried out in fluorine based plasma with significant selectivity to the substrates 14 as discussed earlier.

Once the masking film 12 the anti-reflective layer 18 have been etched into the desired pattern, the masking film 12, the anti-reflective layer 18, and the exposed portions of the layer of photo resist through the anti-reflective layer 18 and masking films 12 are exposed to radiation at a wavelength at or below about 160 nm for use in a lithography process.

Having thus described the basic concept of the invention, it will be rather apparent to those skilled in the art that the foregoing detailed disclosure is intended to be presented by way of example only, and is not limiting. Various alterations, improvements, and modifications will occur and are intended to those skilled in the art, though not expressly stated herein. These alterations, improvements, and modifications are intended to be suggested hereby, and are within the spirit and scope of the invention.

What is claimed is:

1. A mask for use in a lithography process, the mask comprising a masking film made of at least one material with at least a silicon component which provides an attenuated transmission above about 0.5 percent up to about 40 percent and a phase shift of about 180° for radiation at a wavelength at or below about 160 nm.

2. The mask as set forth in claim 1 wherein the material is selected from a group consisting of silicon, silicon dioxide, and silicon nitride.

3. The mask as set forth in claim 1 wherein the material is made of at least one metallic oxide with silicon dioxide.

4. The mask as set forth in claim 3 wherein the metallic oxide is selected from a group consisting of oxides of Ta, Hf, Sn, Mo, Ti, Fe, Ru, W, Mn, Cu, Cr, Ni, V, Nb, In, and Co.

5. The mask as set forth in claim 1 wherein the material is made of at least one metallic nitride with silicon nitride.

6. The mask as set forth in claim 5 wherein the metallic nitride is selected from a group consisting of nitrides of Hf, Ta, Mo, Sn, Ti, Fe, Ru, Mn, Cu, Cr, Ni, V, Nb, In, and Co.

7. The mask as set forth in claim 1 wherein the masking film comprise s a single layer.

8. The mask as set forth in claim 1 wherein the masking film comprises multiple layers.

9. The mask as set forth in claim 1 wherein the masking film allows for transmission up to about 20% at wavelengths up to about 400 nm.

10. The mask as set forth in claim 1 wherein the masking film has a thickness ranging between about 200 and 2000 Å in thickness.

11. The mask as set forth in claim 1 further comprising a substrate made with at least one material with a fluoride component, the masking film located on at least a portion of the substrate.

12. The mask as set forth in claim 1 further comprising a substrate which comprises fused silica with a fluoride film overcoat, the masking film located on at least a portion of the substrate.

13. The mask as set forth in claim 1 wherein the selectivity between the masking film and an underlying substrate is above 10:1.

14. The mask as set forth in claim 1 further comprising an anti-reflective layer located on the masking film.

15. The mask as set forth in claim 14 wherein the anti-reflective layer comprises a silicon based dielectric material coated to a quarter wave thickness to reduce reflectivity below 10%.

16. An attenuated phase shift mask comprising:
a substrate with at least one surface; and
a masking film on at least a portion of the one surface of the substrate, the masking film is made of at least one material with at least a silicon component which provides an attenuated transmission above about 0.5 percent up to about 40 percent and a phase shift of about a 180° for radiation at a wavelength at or below about 160 nm.

17. The mask as set forth in claim 16 wherein the material is selected from a group consisting of silicon, silicon dioxide, and silicon nitride.

18. The mask as set forth in claim 16 wherein the material is made of at least one metallic oxide with silicon dioxide.

19. The mask as set forth in claim 18 wherein the metallic oxide is selected from a group consisting of oxides of Ta, Hf, Sn, Mo, Ti, Fe, Ru, W, Mn, Cu, Cr, Ni, V, Nb, In, and Co.

20. The mask as set forth in claim 16 wherein the material is made of at least one metallic nitride with silicon nitride.

21. The mask as set forth in claim 20 wherein the metallic nitride is selected from a group consisting of nitrides of Hf, Ta, Mo, Sn, Ti, Fe, Ru, Mn, Cu, Cr, Ni, V, Nb, In, and Co.

22. The mask as set forth in claim 16 wherein the masking film comprises a single layer.

23. The mask as set forth in claim 16 wherein the masking film comprises multiple layers.

24. The mask as set forth in claim 16 wherein the masking film allows for transmission up to about 20% at wavelengths up to about 400 nm.

25. The mask as set forth in claim 16 wherein the masking film has a thickness ranging between about 200 and 2000 Å in thickness.

26. The mask as set forth in claim 16 wherein the substrate is made with at least one material with a fluoride component.

27. The mask as set forth in claim 16 wherein the substrate comprises fused silica with a fluoride film overcoat.

28. The mask as set forth in claim 16 wherein the selectivity between the masking film and the substrate is above 10:1.

29. The mask as set forth in claim 16 further comprising an anti-reflective layer located on the masking film.

30. The mask as set forth in claim 29 wherein the anti-reflective layer comprises a silicon based dielectric material coated to a quarter wave thickness to reduce reflectivity below 10%.

31. A method for lithography comprising:
placing a masking film over at least a portion of one surface of a substrate, the masking film made of at least one material with at least a silicon component; and
exposing the masking film and the substrate to radiation at a wavelength at or below about 160 nm, wherein the masking film provides an attenuated transmission above about 0.5 percent up to about 40 percent and a phase shift of about a 180° for radiation at a wavelength at or below about 160 nm.

32. The method as set forth in claim 31 further comprising etching the masking film using an etch chemistry prior to the step of exposing.

33. The method as set forth in claim 31 wherein the masking film and the substrate are made of materials which are not substantially etched in the same etch chemistry.

34. The method as set forth in claim 31 wherein the masking film is deposited onto the one surface of the substrate by vapor deposition.

35. The method as set forth in claim 31 wherein the material is selected from a group consisting of silicon, silicon dioxide, and silicon nitride.

36. The method as set forth in claim 31 wherein the masking film is made of at least one metallic oxide.

37. The method as set forth in claim 36 wherein the metallic oxide is selected from a group consisting of oxides of Ta, Hf, Sn, Mo, Ti, Fe, Ru, W, Mn, Cu, Cr, Ni, V, Nb, In, and Co with silicon dioxide.

38. The method as set forth in claim 31 wherein the masking film is made of at least one metallic nitride.

39. The method as set forth in claim 38 wherein the metallic nitride is selected from a group consisting of nitrides of Hf, Ta, Mo, Sn, Ti, Fe, Ru, Mn, Cu, Cr, Ni, V, Nb, In, and Co with silicon nitride.

40. The method as set forth in claim 31 wherein the substrate is made with at least one material with a fluoride component.

41. The method as set forth in claim 31 wherein the substrate comprises fused silica with a fluoride film overcoat.

42. The method as set forth in claim 31 further comprising placing an anti-reflective layer on the masking film.

43. The method as set forth in claim 42 wherein the anti-reflective layer comprises a silicon based dielectric material coated to a quarter wave thickness to reduce reflectivity below 10%.

44. A mask for use in a lithography process, the mask comprising a masking film made of at least silicon which provides an attenuated transmission above about 0.5 up to about 40 percent for radiation at a wavelength at or below about 160 nm.

45. The mask as set forth in claim 44 further comprising a substrate made with at least one material with a fluoride component, the masking film located on at least a portion of the substrate.

46. The mask as set forth in claim 44 wherein the selectivity between the masking film and an underlying substrate is above 10:1.

47. The mask as set forth in claim 44 further comprising an anti-reflective layer located on the masking film.

48. The mask as set forth in claim 47 wherein the anti-reflective layer comprises a silicon based dielectric material coated to a quarter wave thickness to reduce reflectivity below 10%.

49. A mask comprising:
a substrate with at least one surface; and
a masking film on the one surface of the substrate, the masking film comprising silicon which provides an attenuated transmission above about 0.5 percent up to about 40 percent for radiation at a wavelength at or below about 160 nm.

50. The mask as set forth in claim 49 wherein the substrate is made with at least one material with a fluoride component.

51. The mask as set forth in claim 49 wherein the selectivity between the masking film and the substrate is above 10:1.

52. The mask as set forth in claim 49 further comprising an anti-reflective layer located on the masking film.

53. The mask as set forth in claim 49 wherein the anti-reflective layer comprises a silicon based dielectric material coated to a quarter wave thickness to reduce reflectivity below 10%.

54. A method for lithography comprising:
placing a masking film over at least a portion of one surface of a substrate, the masking film comprising silicon; and exposing the masking film to radiation at a wavelength at or below about 160 nm, wherein the masking film provides an attenuated transmission above about 0.5 percent up to about 40 percent for radiation at a wavelength at or below about 160 nm.

55. The method as set forth in claim 54 further comprising etching the masking film using an etch chemistry prior to the step of exposing.

56. The method as set forth in claim 54 wherein the masking film and the substrate are made of materials which are not substantially etched in the same etch chemistry.

57. The method as set forth in claim 54 wherein the masking film is deposited onto the one surface of the substrate by vapor deposition.

58. The method as set forth in claim 54 wherein the substrate is made with at least one material with a fluoride component.

59. The method as set forth in claim 54 wherein the substrate comprises fused silica with a fluoride film overcoat.

60. The method as set forth in claim 54 further comprising placing an anti-reflective layer on the masking film.

61. The method as set forth in claim 60 wherein the anti-reflective layer comprises a silicon based dielectric material coated to a quarter wave thickness to reduce reflectivity below 10%.

62. The mask as set forth in claim 1 further comprising a substrate.

63. The mask as set forth in claim 62 wherein the etch selectivity between the substrate and the masking film is below 10:1.

* * * * *